United States Patent [19]
Fletcher et al.

[11] Patent Number: 6,037,096
[45] Date of Patent: Mar. 14, 2000

[54] FILM COMPOSITION AND METHOD FOR A PLANAR SURFACE ATOP A PLATED THROUGH HOLE

[75] Inventors: Mary Beth Fletcher, Vestal; Robert L. Nedbalski; Konstantinos I. Papathomas, both of Endicott; Amarjit Singh Rai, Vestal, all of N.Y.

[73] Assignee: International Business Machines Corporation, Armonk, N.Y.

[21] Appl. No.: 09/085,117

[22] Filed: May 26, 1998

[51] Int. Cl.⁷ .............................. G03C 11/12; B32B 3/00
[52] U.S. Cl. .................... 430/256; 430/258; 430/313; 430/319; 427/97; 428/195
[58] Field of Search .................... 430/256, 259, 430/260, 319, 313, 312; 427/97; 428/195

[56] References Cited

U.S. PATENT DOCUMENTS

| | | |
|---|---|---|
| 4,127,436 | 11/1978 | Friel ........................................... 427/96 |
| 4,567,128 | 1/1986 | Bennett ..................................... 430/313 |
| 4,572,764 | 2/1986 | Fan ........................................... 430/313 |
| 4,927,733 | 5/1990 | Stout . |
| 5,240,817 | 8/1993 | Stout et al. . |
| 5,277,929 | 1/1994 | Seki et al. . |
| 5,536,620 | 7/1996 | Dueber et al. . |
| 5,557,844 | 9/1996 | Bhatt et al. ................................. 29/852 |
| 5,571,593 | 11/1996 | Arldt et al. . |
| 5,643,657 | 7/1997 | Dueber et al. . |

*Primary Examiner*—Cynthia Hamilton
*Assistant Examiner*—Yvette M. Clarke
*Attorney, Agent, or Firm*—Scully, Scott, Murphy & Presser

[57] ABSTRACT

The present invention relates to a method for planarizing circuit board apertures wherein a photoimageable film composition comprising a photoimageable dielectric composition and a support film is employed to fill the circuit board apertures. Precircuitized and postcircuitized embodiments are discussed.

29 Claims, 5 Drawing Sheets

FILM COMPOSITION AND METHOD FOR A PLANAR SURFACE ATOP A PLATED THROUGH HOLE

FIELD OF THE INVENTION

The present invention relates to fabricating circuit boards and, in particular to a method of filling the apertures on a patterned or unpatterned circuit board. In the case of patterned circuit boards, i.e. circuitized boards, the apertures are filled and thereafter planarized without the need of removing the photoimageable dielectric nubs that are formed atop the apertures. In instances wherein unpatterned circuit boards are employed, i.e. non-circuitized boards, the apertures are filled, the nubs that are formed are removed and the board is circuitized.

BACKGROUND OF THE INVENTION

In the field of circuit board processing, the apertures on the circuit board are generally filled utilizing a method which requires the use of a drilled metal mask and a subsequent planarization step. Specifically, prior art fill processes are carried out by first applying a drilled metal mask, e.g. Cu, to at least one surface of a circuit board having apertures and circuitry therein. The drilled metal mask has openings so as to expose the apertures on said circuit board. Next, a composite comprising a non-photoactive fill material such as a conductive or non-conductive filled dielectric and a carrier is applied to the drilled metal mask so that the fill material is in contact with the metal mask. This structure is then subjected to vacuum lamination to cause the non-photoactive fill material to flow into the apertures of the circuit board. After vacuum lamination, the drilled mask and the fill carrier are removed and the structure is subjected to a planarization process such as chemical mechanical polishing (CMP).

The above described prior art process requires that an extra planarization step, which adds time and cost to the overall process, be employed to provide a planarized surface. A planar surface is essential and required for such structures in order for it to be utilized in subsequent assembly operations such as use of liquid resists for fine line circuitry, plated through hole protection, overmold, globtop or die attach.

In recent technology, liquid solder masks are now being employed to both fill the apertures and to protect the circuitry on the circuit board. A major problem with using such solder masks to fill the apertures and protect the circuitry is that an excessive thin coating of the solder mask material forms around the rim of the apertures. This thin coating is considered a defect and can contribute to high yield loss.

In view of the drawbacks mentioned with prior art processes of filling the apertures of a circuit board, there is a continued need to develop a new method which eliminates the prior art's required use of a planarization step to provide a circuit board structure having a planarized surface. Moreover, there is also a need to develop a method wherein rim defects are substantially eliminated.

SUMMARY OF THE INVENTION

One object of the present invention is to provide a method for planarizing circuit boards containing filled apertures that eliminates the need of a separate planarization or nub removal processing step which is typically required in prior art processes.

Another object of the present invention is to provide a method for planarizing circuit board apertures that eliminates the need for removing the nub formed over the apertures which is also typically required by prior art processes.

A further object of the present invention is to provide a method for planarizing circuit board apertures which prevents the formation of thin rims atop the apertures and provides a uniform solder mask coating on the circuit board.

A yet further object of the present invention is to provide a method which provides a planar liquid or film solder on apertures of a circuit board that prevents formation of the thin coating around the apertures; provides a planar surface atop an aperture which is capable of preventing copper etch back in the apertures by post circuitization processes; provides a planar surface atop an aperture for enhancing flow underfills in a flip-chip encapsulated package; and also provides planar filled plated through holes for use with liquid resists for fine line circuitry.

These as well as other objects and advantages are achieved in the present invention by utilizing a photoimageable dielectric (PID) composition as a material to fill the apertures on a patterned or unpatterned circuit board. Specifically, when a patterned circuit board is employed, the method of the present invention, which provides a means for planarizing the circuit board apertures, comprises the steps of:

(a) applying a photoimageable dielectric composition onto a surface of a support film to provide a photoimageable film composition, wherein said support film is peelable and is optically transparent;

(b) drying the support photoimageable film composition to remove any solvent present therein;

(c) applying said dry, photoimageable film composition adjacent to at least one surface of a patterned circuit board having apertures therein;

(d) vacuum laminating said structure provided in step (c) under conditions effective to soften said dry, photoimageable film composition so that said soften material flows into said apertures and fills the same;

(e) exposing the structure provided in step (d) in a desired aperture-wise pattern;

(f) peeling the support film and developing regions of the photoimageable film composition from said surface of said circuit board whereby nubs are formed over said apertures;

(g) applying a solder mask to the structure provided in (f);

(h) patterning areas in said solder mask; and (i) curing said solder mask.

It should be noted that the above mentioned processing steps are applicable for post-circuitized circuit boards wherein the aperture fill processing steps mentioned above are conducted on a board which is circuitized.

In the precircuitization case, the initial circuit board is not patterned. When such pre-circuitized circuit boards are employed, the method of the present invention comprises the following steps:

(a) applying a photoimageable dielectric composition onto a surface of a support film to provide a photoimageable film composition, wherein said support film is peelable and is optically transparent;

(b) drying the support photoimageable film composition to remove any solvent present therein;

(c) applying said dry, photoimageable film composition adjacent to at least one surface of an unpatterned circuit board having apertures therein;

(d) vacuum laminating said structure provided in step (c) under conditions effective to soften said dry, photoimageable film composition so that said soften material flows into said apertures and fills the same;

(e) exposing the structure provided in step (d) in a desired aperture-wise pattern;

(f) peeling the support film and developing regions of the photoimageable film composition from said surface of said circuit board whereby nubs are formed over said apertures;

(g) optionally curing said nubs formed in step (f);

(h) removing said nubs or said optionally cured nubs;

(i) circuitizing the structure in a desired pattern;

(j) applying a solder mask to the structure;

(j) patterning said solder mask; and (k) curing said solder mask.

DETAILED DESCRIPTION OF THE PRESENT INVENTION

Figure 1A:
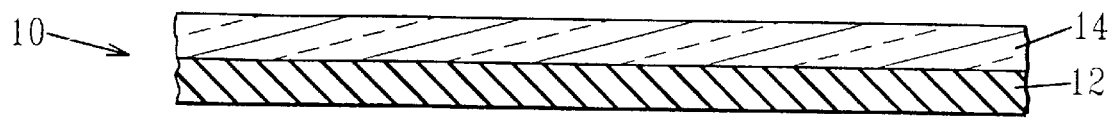
FIGS. 1(a)–(f) are cross-sectional views illustrating the various processing steps employed in the present invention to provide a planar surface atop the apertures of a patterned circuit board.

The present invention will now be described in more detail with reference to the accompanying drawings wherein like reference numerals are used for like and corresponding elements of the drawings. Referring first to FIG. 1(a), there is shown the photoimageable film composition 10 that is employed in the present invention. Specifically, photoimageable film composition 10 comprises a photoimageable dielectric composition 12 and a support film 14.

The photoimageable film composition shown in FIG. 1(a) is made by applying photoimageable dielectric composition 12 to support film 14 by standard coating techniques well known to those skilled in the art. Suitable coating techniques that can be employed in the present invention in applying the photoimageable dielectric composition to the support film include, but are not limited to: screen coating, wire coating, roll coating and other like coating techniques. A highly preferred coating method employed in the present invention in applying photoimageable dielectric composition 12 to support film 10 is screen coating.

Depending on the type of coating process employed in the present invention, the thickness of photoimageable dielectric composition 12 may vary. It is however preferred that the coating process be capable of providing a layer of the photoimageable dielectric composition that has a thickness of from about 0.5 to about 4 mils. More preferably, the coating process provides a coating of the photoimageable dielectric composition that has a thickness of from about 1.0 to about 3.0 mils.

The support film employed in the present invention is a film that is capable of being peeled and that is optically transparent, i.e. it allows light to pass through it. Hence, the support film employed in the present invention is not opaque. Suitable support films that satisfy the above criteria include: but are not limited to: polyester resins, polyolefins, and polyimides. Of these support films, it is highly preferred that a polyester resin such as MYLAR® be employed in the present invention.

The photoimageable dielectric compositions employed in the present invention are conventional photodefined dielectric materials that are well known to those skilled in the art. They can comprise aqueous compositions or solvent processable compositions.

While the present invention is not limited to any one particular photoimageable dielectric composition, one highly preferred photoimageable dielectric that may be employed in the present invention is a photoimageable cationically polymerizable epoxy based resin system which is comprised of solids and solvent. The solids are preferably comprised of an epoxy resin system which comprises from about 10% to about 80% by weight, preferably 20% to 40% by weight, more preferably about 30% by weight, of a phenoxy polyol resin which is a condensation product of epichlorohydrin and bisphenol A having a molecular weight of between about 40,000 and about 130,000, preferably about 60,000 to about 90,000, more preferably greater than about 60,000; from about 20% to about 90% by weight, more preferably from about 25% to about 30% by weight, most preferably about 25% by weight, of an epoxidized multifunctional bisphenol A formaldehyde novolac resin having a molecular weight of from about 4,000 to about 10,000, preferably about 5,000 to about 7,000; from about 0% to about 50% by weight, preferably from about 35% to about 50% by weight, more preferably about 45% by weight, of a halogenated, preferably brominated, diglycidyl ether of bisphenol A having a molecular weight of from about 600 to about 2,500, preferably about 1,000 to about 1,700; and from about 0.1 to about 15 parts, preferably about 5 parts, by weight of the total epoxy resin of a cationic photoinitiator capable of initiating polymerization of said epoxy based resin system. The solvent component of the epoxy based resin system employed in the present invention is comprised of propylene glycol monomethyl ether acetate and 0 to less than about 10% propylene carbonate. The propylene carbonate is preferably the carrier for the photoinitiator.

Preferably, the phenoxy polyol resin has an epoxide value of from about 0.001 to about 3, more preferably about 0.03 equivalents per kg, a weight per epoxide of from about 10,000 to about 60,000, more preferably from about 20,000 to about 50,000, most preferably about 37,000 and a glass transition temperature of from about 80° C. to about 150° C., more preferably from about 90° C. to about 110° C., most preferably about 98° C.

Preferably, the multifunctional epoxy bisphenol A formaldehyde novolac resin has an epoxide value of from about 1 to about 10, more preferably from about 3 to about 6, most preferably about 4.7 equivalents per kg, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the halogenated bisphenol A, has an epoxide value of from about 0.1 to about 5, more preferably from about 1 to about 3, most preferably about 1.5 equivalents per kg, a weight per epoxide of from about 200 to about 1000, more preferably from about 500 to about 750, most preferably 675 and a melting point of from about 70° C. to about 150° C., more preferably from about 80° C. to about 110° C., most preferably about 97° C.

A suitable phenoxy polyol resin is available under the trade name "PKHC", formerly available from Union Carbide Corporation, now available from Phenoxy Resin Associates. A suitable multifunctional bisphenol A under the trade name Epon SU8 is available from Shell Oil Company. A suitable complex triarylsulfonium hexafluoroantimonate salt photoinitiator, formerly available under the trade name 1014 from General Electric Company, is now available as "UVI-6974" from Union Carbide.

Other photoimageable dielectric compositions that can be used in the present invention may also consist of, a photopolymerizable unsaturated compound comprising at least one compound having at least two terminal ethylene groups. These compounds include for example, polyhydric alcohol acrylates and methacrylates, preferable examples are acrylates and methacrylates of triethylene glycol, tetraethylene glycol, ethylene glycol, propylene glycol, trimethylolpropane, pentaerythritol, neopentyl glycol and the like. The photopolymerizable unsaturated compounds also include acrylates and methacrylates derived from modified bisphenol A, such as reaction product of acrylic acid or methacrylic acid with a bisphenol A-epichlorohydrin epoxy resin prepolymer and acrylates and methacrylates of alkylene oxide adduct of bisphenol A or its hydrogenation product.

In addition to these esters, as the photopolymerizable unsaturated compound, there may also usefully be used methylene bis-acrylamide, methylene-bis-methacrylamide, bis-acryl- and bis-methacryl-amides of diamines, such as ethylenediamine, propylenediamine, butylenediamine, pentamethylenediamine, hexamethylenediamine, octamethylenediamine, etc. Furthermore, reaction products of diol monoacrylate or diol methacrylate with diisocyanate and triacryl formal or triallyl cyanurate are also suitable.

Besides these monomeric compounds, linear high molecular weight compounds containing an acryloyloxy or a methacryloyloxy group in the side chain, for example, a ring-opening copolymerization product of glycidyl methacrylate or addition reaction product of acrylic or methacrylic acid with copolymerization product of glycidyl methacrylate with a vinyl compound, such as methyl methacrylate, styrene, ethyl acrylate, methyl acrylate or butyl methacrylate, may be employed.

Examples of photocurable monomers include 2-hydroxypropyl acrylate, 2-hydroxyethyl acrylate, N-vinylpyrrolidone, acryloyl morpholine, methoxytetraethylene glycol acrylate, methoxypolyethylene glycol acrylate, polyethylene glycol diacrylate, N,N-dimethyl acrylamide, N-methylol acrylamide, N,N-dimethylaminopropyl acrylamide, N,N-dimethylaminoethyl acrylate, N,N-dimethylaminopropyl acrylate, melamine acrylate, diethylene glycol diacrylate, triethylene glycol diacrylate, propylene glycol diacrylate, dipropylene glycol diacrylate, tripropylene glycol diacrylate, polypropylene glycol diacrylate, phenoxy-ethyl acrylate, cyclohexyl acrylate, trimethylol propane diacrylate, trimethylol propane triacrylate, pentaerythritol triacrylate, pentaerythritol tetraacrylate, isobornyl acrylate, cyclopentadiene mono- or di-acrylates.

Typical examples of initiators include benzoin, benzoin methyl ether, benzoin ethyl ether, and benzoin isopropyl ether, acetophenone such as acetophenone, 2,2-dimethoxy-2-phenyl acetophenone, 2,2-diethoxy-2-phenyl acetophenone, 1,1-dichloroacetophenone, 1-hydroxycyclohexyl phenyl ketone, 2-methyl-1-[4-(methylthio)phenyl]-2-morpholinopropane-1-on, 2-benzyl-2-dimethylamino-1-(4-morpholinophentyl)-1-butanone; anthraquinones such as 2-methylanthraquinone, 2-ethylanthraquinone, 2-t-butyl anthraquinone, 1-chloroantraquinone and 2-amylanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone and xanthones. These initiators may be either singly or in combination with one or more.

The amount of the photoinitiator to be used is in the range of from 0.2 to 10 parts by weight based on 100 parts by weight of the radiation curable resin used in the composition.

Essential additives to the photoimageable dielectric compositions of this invention is a sensitizer capable of initiating polymerization of the photopolymerizable unsaturated compound upon irradiation with active rays. Preferable sensitizers are benzophenone, Michler's ketone, benzoin, benzoin alkyl ethers, anthraquinone, alkyl-substituted anthraquinones, such as 2-ethyl-anthraquinone, 3-t-butyl-anthraquinone, benzil and the like.

The photopolymerizable unsaturated compound and the sensitizer may be used in an amount of 10 to 90% by weight and 0.1 to 15% by weight, respectively, more preferably in an amount of 15 to 60% by weight and 1 to 10% by weight, respectively, based on the weight of the photosensitive resin composition.

Other suitable compounds identified as epoxy resin prepolymers, such as bisphenol A epichlorohydrin condensate, polyolefin epoxides, novolac resin epoxides can be used in the present invention. For examples, Epon 828, Epon 1001, Epon 1004, Epon 1007 from Shell Chemical, Araldite ECN-1280, Araldite ECN-1273 from Ciba, DEN 438, DEN 431 from Dow Chemical. Vinyl copolymerization products of glycidyl methacrylate may also be used. These may be employed alone or in admixture of two or more. The amount of the compound may preferably be 5 to 80% by weight, more preferably 5 to 50% by weigh, based on the weight of the photosensitive resin composition.

Other essential compounds to make-up the photoimageable dielectric composition for use in the present invention may be selected from the group consisting of dicyandiamide, p,p'-diamino-phenyl compounds, monocarboxylic acids and polycarboxylic acids having at least two carboxyl groups, polycarboxylic acids and the polycarboxylic anhydrides. In the case of dicyandiamide, the preferable amounts are 0.1 to 20% by weight based on the weight of the composition. In the case of the p,p'-diaminodiphenyl compound, it may be used in an amount of 1 to 30% by weight, more preferably 2 to 20% by weight based on the weight of the composition. Further, in the case of the polycarboxylic acid and/or the polycarboxylic anhydride, it may preferably be used in an amount of 0.3 to 1.5 moles per mole of the epoxy group in the composition.

Monocarboxylic acids include but are not limited to acrylic acid, methacrylic acid, cinnamic acid, and reaction product of a saturated or unsaturated dibasic acid anhydrides with a (meth)acrylate having one hydroxyl group per molecule. These unsaturated monocarboxylic acids may be used either singly or in the form of a combination of two or more members. Among other monocarboxylic acids cited above, acrylic acid and methacrylic acid, particularly acrylic acid, prove to be particularly desirable from the viewpoint of the photocuring property.

The polycarboxylic anhydrides used may include maleic anhydride, itaconic, succinic, citraconic, phthalic, tetrahydrophthalic, hexahydrophthalic, methyltetrahydrophthalic, chlorendic, pyromellitic, trimellitic anhydride and copolymers of maleic anhydride with other vinyl compounds, such as methyl methacrylate, styrene, ethyl acrylate, methyl acrylate or butyl methacrylate.

In order to accelerate the curing reaction of the epoxy compound, conventional curing accelerators for epoxy resins may be added to the photosensitive resin compositions. Examples of the curing accelerator are amine-boron trifluoride complex, fluoboric acid amine salt, tetraphenylphosphonium tetraphenylborate, 2-ethyl-4-methylimidazole, 2-ethyl-4-methylimidazolezinc octenate complex and the like. In general, the curing accelerator may be used in an amount of 0 to 5% by weight based on the weight of the epoxy compound The photoimageable dielectric composition of the present invention, when necessary, may incorporate well-known organic solvents. Examples of the organic solvents include, but are not limited to: ketones such as methyl-ethyl ketone and cyclohexanone, aromatic hydrocarbons such as toluene, xylene, glycol ethers, such as cellosolve, butyl cellosolve, carbitol, butyl carbitol, propylene glycol monomethyl ether, dipropylene glycol monomethyl ether, and acetates such as ethyl acetate, butyl acetate, cellosolve acetate, butyl cellosolve acetate, carbitol acetate, butyl carbitol acetate, propylene glycol monomethyl ether acetate and dipropylene glycol monomethyl ether acetate. These organic solvents may be used either singly or in the form of a combination of two or more members.

Preferred photoimageable dielectrics that may be employed in the present invention include: PSR-4000 MP, PSR-4000, H84 and AUS5 from Taiyo Inc. Japan, Enthone DSR liquid photoimageable solder masks, Epic 200 M from Morton Electronics, Probimer 74 solder mask from Ciba and other photoimageable dielectrics.

It should be noted that the photoimageable dielectric composition employed in the present invention after coating onto the support film has an elevated solvent content which is up to about 30% by weight. Typically, this elevated solvent content is removed prior to lamination by heating the photoimageable film composition shown in FIG. 1(a) at temperatures of about 120° C. or less for a time period of from about 5 to about 90 minutes. More preferably, the elevated solvent content is reduced by heating the photoimageable film composition at a temperature of from about 60° to about 100° C. for a time period of from about 15 to about 60 minutes.

Figure 1B:
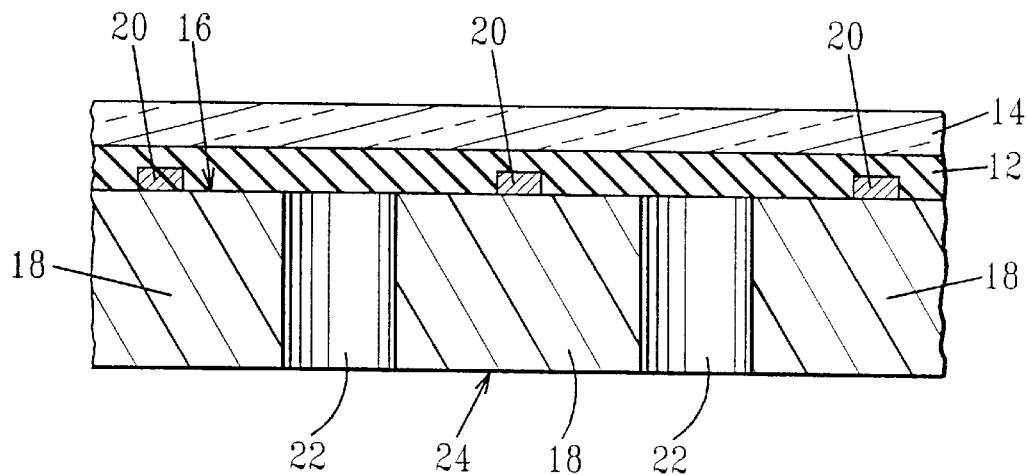

Photoimageable film composition 10 of FIG. 1(a) is then applied adjacent to at least one surface, e.g. 16, of a patterned or unpatterned circuit board 18 having apertures 22 therein so that the dry photoimageable dielectric composition layer 12 is in contact with at least one surface 16 of the circuit board 18. Although the photoimageable film composition may be applied by mechanical means to the circuit board substrate in a patterned or non-patterned condition, it is typically applied by hand, i.e. by laying-up. This step of the present invention is shown in FIG. 1(b) for the patterned circuit board and in FIG. 2(a) for the unpatterned circuit board. The term "apertures" is used herein to include vias as well as through holes such as plated through holes and non-plated through holes. In the drawings, the apertures are shown as non-plated through holes.

When the apertures are plated through holes, a metal such as Cu is employed. The metals used in forming the plating through holes are plated using known plating techniques.

The circuit board may also contain bond pads 20 which are fabricated on the surfaces of circuit board 18 using techniques well known to those skilled in the art. A preferred material for bond pad 20 is Cu. The bond pads are normally finished with plated Ni and Au as the external metal finish. In addition to the features mentioned above, circuit board 18 may contain other intermediate layers or have circuitry thereon. For clarity these additional elements are not shown in the drawings of the present invention.

Typically, the circuit board is composed of brominated epoxy resin, cyanate esters resins, bis-maleimide triazines, polyimides and mixtures of them with epoxies which are each impregnated in glass cloth. Other materials that can be used in fabricating the circuit board include thermosetting resins or thermoplastic resins. Although the specification is specific for circuit boards, it also contemplates circuit cards and other organic substrates that contain circuitry.

The circuit board containing the apertures is fabricated using techniques well known to those skilled in the art. Since such techniques are well known to those skilled in the art, and in any event are not critical to the present invention, a detail discussion of the same is not presented herein.

In an optional embodiment of the present invention, the surface not containing the dry photoimageable film composition of the present invention e.g. 24, may contain a release film that is capable of protecting the backside of the circuit board. Suitable release films that may be optionally employed in the present invention include: TEFLON®, MYLAR® or TEDLAR®.

Figure 2A:
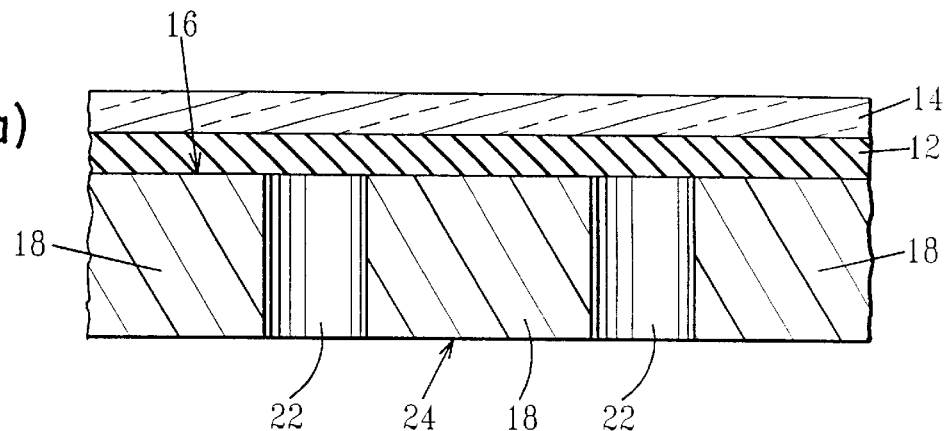
FIGS. 2(a)–(g) are cross-sectional views illustrating the various processing steps employed in the present invention to provide a planar surface atop the apertures of an unpatterned circuit board. These figures are for the case when the circuit board is circuitized post filling the apertures.

After applying the photoimageable film composition to the circuit board, the structure shown in FIG. 1(b) or FIG. 2(a) is then subjected to lamination under conditions that are sufficient to soften the photoimageable film composition such that the soften material is sufficiently fluid to flow into the apertures. The lamination can be carried out utilizing a high pressure vacuum lamination process or a resist vacuum lamination process.

When a high vacuum lamination process is employed, the pressure of the lamination process is from about 150 to about 500 psi and the temperature during lamination is raised from room temperature to a temperature of about 150° C. at a ramp rate of from about 4 to about 15° C./min. Once the desire temperature is reached—temperature wherein the photoimageable dielectric composition becomes fluid—that temperature is held for a time period of from about 5 to about 30 minutes. Thereafter, the structure is allowed to cool to room temperature so that the soften photoimageable dielectric composition solidifies.

When a resist vacuum lamination process is employed in the present invention, the lamination is carried out at a pressure of from about 5 to about 25 psi. The temperature, like that of the high vacuum lamination process described above, is raised from room temperature to a temperature of from about 110° C. at a rate of from about 3 to about 10° C./min. Once the desired temperature is reached, which is sufficient to fluidize the photoimageable dielectric composition, the fluid temperature is maintained for a time period of from about 2 to about 10 minutes and thereafter, the structure is cooled back to room temperature to allow the soften photoimageable dielectric composition to solidify.

Figure 1C:
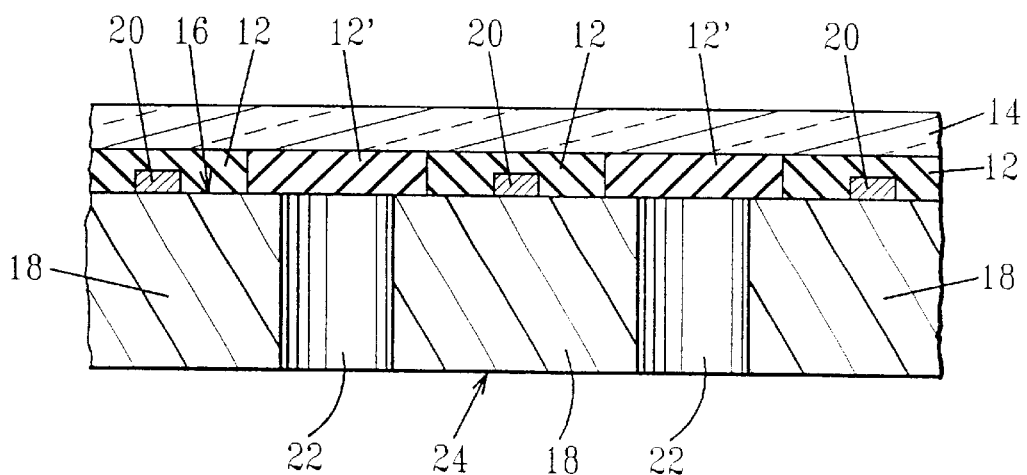
Figure 2B:
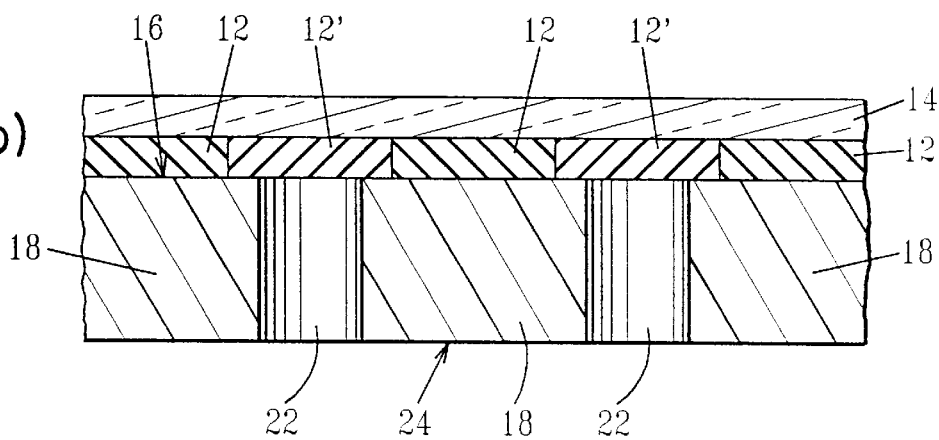

The structure which now contains the photoimageable dielectric composition in the apertures is then exposed in a desired aperture-wise pattern so that the photoimageable film composition around and within the apertures is made harden, i.e. it is made insoluble in common developer solutions. This step of the present invention is shown in FIG. 1(c) or FIG. 2(b) wherein the harden portions are represented as 12'.

This selective hardening process is carried out by overlaying a photo-master on top of support layer 14 and then using a conventional exposure device operating at a photo-master contact pressure of from about 3 to about 8 psi, an energy from about 800 to about 2000 milliJoules/cm$^2$, using a 365 nanometer arc 8 Kilowatt lamp. More preferably, the exposure is carried out at a photo-master pressure of from about 4 to about 6 psi, an energy of from about 1000 to about 1500 milliJoules/cm$^2$, using a 365 nanometer arc 8 Kilowatt lamp. The most preferred conditions for providing the selective hardening effect to photoimageable layer 12 are 5 psi, 1500 milliJoules/cm$^2$, using an 8 Kilowatt lamp.

After exposing the photoimageable film composition in the desired aperture-wise pattern, support film 14 is peeled away from photoimageable dielectric composition 12 and the harden areas of photoimageable dielectric composition 12'.

The unexposed portions of the photoimageable dielectric composition that were not hardened by the exposure process are then removed, i.e. developed, utilizing standard developer solutions that dissolve away the unexposed regions. Generally, the pattern is developed utilizing an organic solvent or aqueous solution including, but not limited to: sodium hydroxide, propylene carbonate, gamma butyrolactone, sodium carbonate, benzyl alcohol, diglyme or mixtures thereof.

Figure 1D:
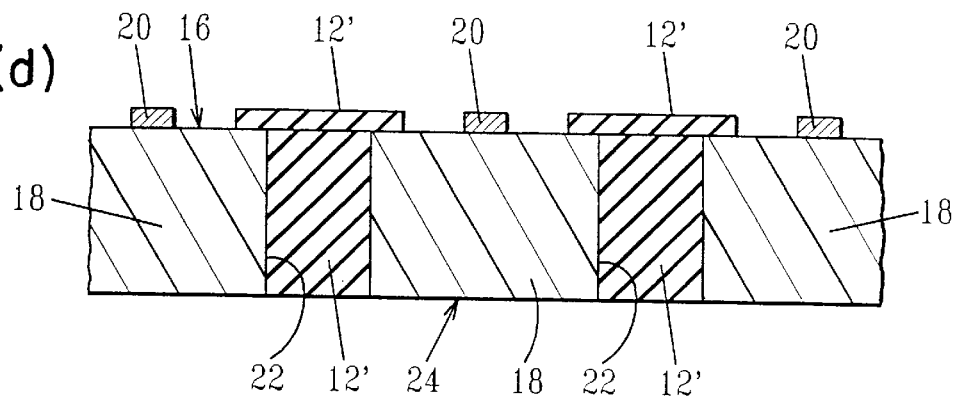
Figure 2C:
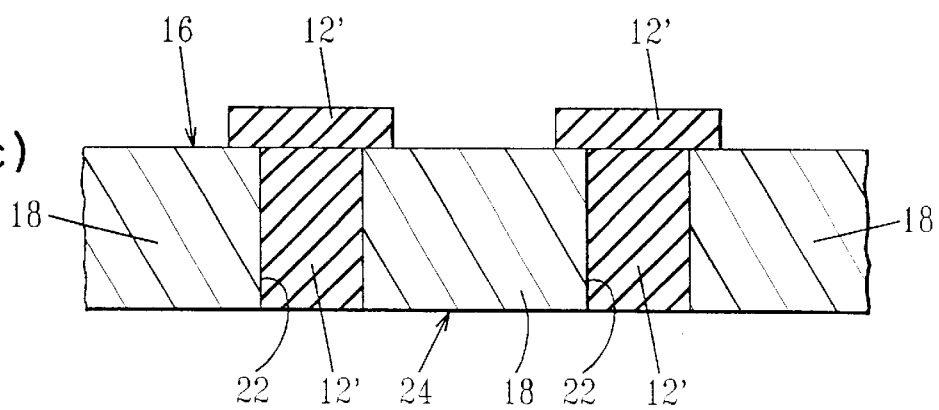

The development step of the present invention provides the structure shown in FIG. 1(d) or FIG. 2(c) wherein the circuit board 18 contains apertures 22 that are filled with harden photoimageable dielectric composition 12'. Additionally, a nub composed of harden photoimageable dielectric composition 12' is also formed atop the apertures. The nub is also represented by 12' in the drawings of the present invention.

So far the processing steps used in forming the filled circuit boards are the same for the patterned circuit board and the unpatterned circuit board. Hereinafter the processing steps deviate somewhat from case to case. Hence, the further processing steps used in each case will now be described separately. The further processing steps in regard to the patterned circuit board will be described first and then a description of the processing steps in the nonpatterned circuit board will be described later.

Figure 1E:
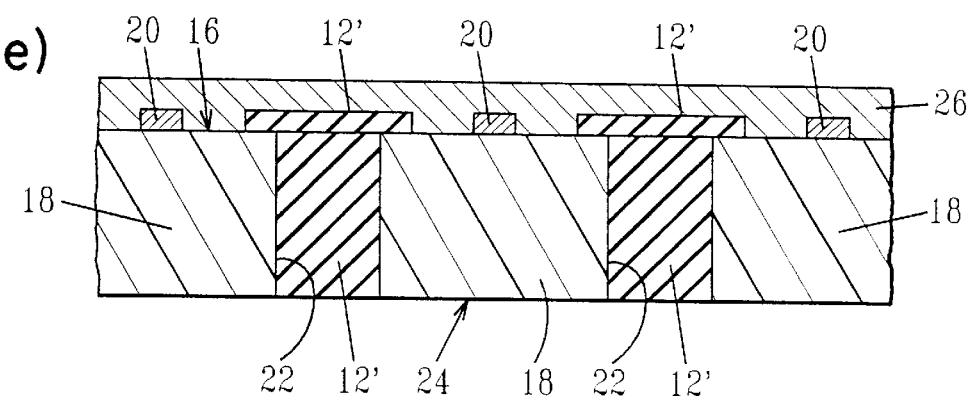

In accordance with the next step of the present invention, see FIG. 1(e), a solder mask 26 is applied to the surface of patterned circuit board 18 containing nubs 12' using conventional coating techniques well known to those skilled in the art. The solder mask employed in the present invention is a conventional mask material well known to those skilled in the art which is comprised of a conventional liquid or film photoimageable dielectric material. This includes the type previously mentioned hereinabove. A desired pattern is then defined on the solder mask using conventional techniques which include blanket light exposure, solvent development and curing.

The light exposure step employed in this step of the present invention is different from the previous exposure step in that a UV cure tool that operates at high UV energies is employed. By "high UV energies" it is meant that the blanket exposure step is conducted at energies of from about 500 to about 2500 Joules/cm$^2$. More preferably, the UV cure tool operates at energies of from about 200 to about 1500 Joules/cm$^2$. This step of the present invention also changes the solubility of the solder mask by hardening the exposed areas so that those areas are difficult to remove by contact with a developer solution. The unexposed areas are then developed as described hereinabove and the final structure is cured at a temperature of from about 100° to about 150° C. for a time period of from about 60 to about 180 minutes. More preferably, the curing step is carried out at a temperature of from about 130° to about 150° C. for a time period of from about 60 to about 120 minutes.

Figure 1F:
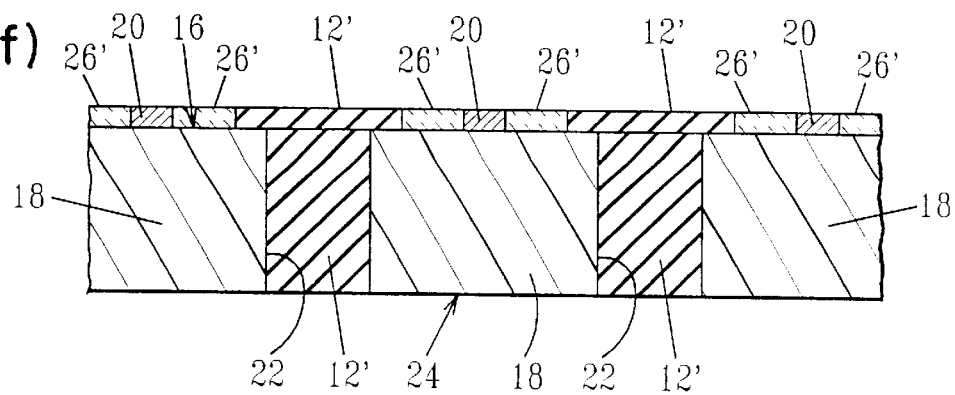

The permanently cured structure comprising filled apertures 22, nub 12' and cured solder mask 26' is shown in FIG. 1(f). An unique aspect of the present invention, which is apparent from the description above, is that the structure shown in FIG. 1(f) can be prepared without the need of utilizing any planarization or nub removal techniques. Additionally, since no planarization technique is required the nubs remain in the structures for filling apertures post-circuitization.

In the case of the filled nonpatterned circuit board of FIG. 2(c), nubs 12' are removed by utilizing standard polishing techniques which include, but are not limited to: chemical mechanical polishing (CMP), chemical polishing or belt sanding. A preferred way of removing nubs 12' is by CMP. The aperture filled structure after nub removal is shown in FIG. 2(d).

In one optional embodiment of the present invention, the nubs are first cured and then removed as described above. Specifically, the nubs are cured at a temperature of from about 100° to about 150° C. for a time period of from about 60 to 180 minutes. More preferably, this optional curing step occurs at a temperature of from about 130° to about 150° C. for a time period of from about 60 to about 120 minutes.

Figure 2D:
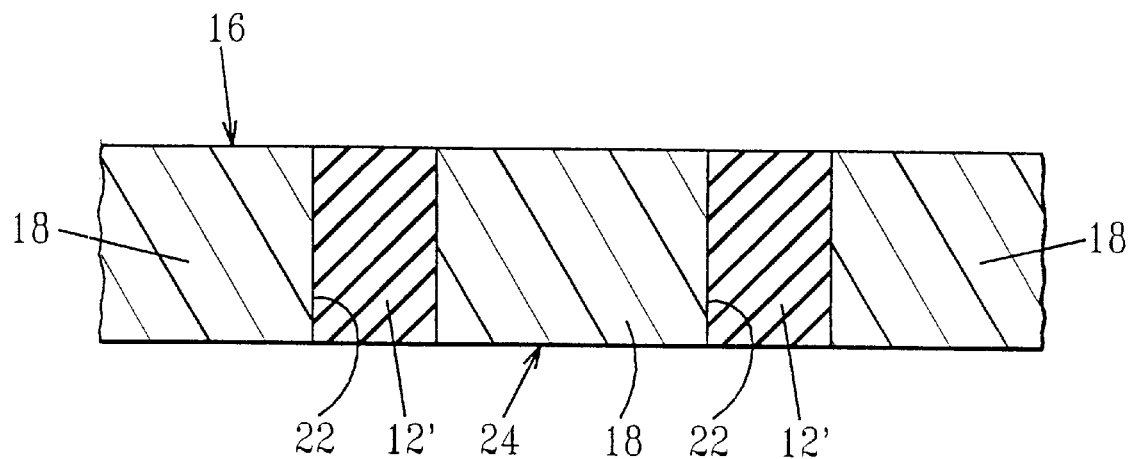
Figure 2E:
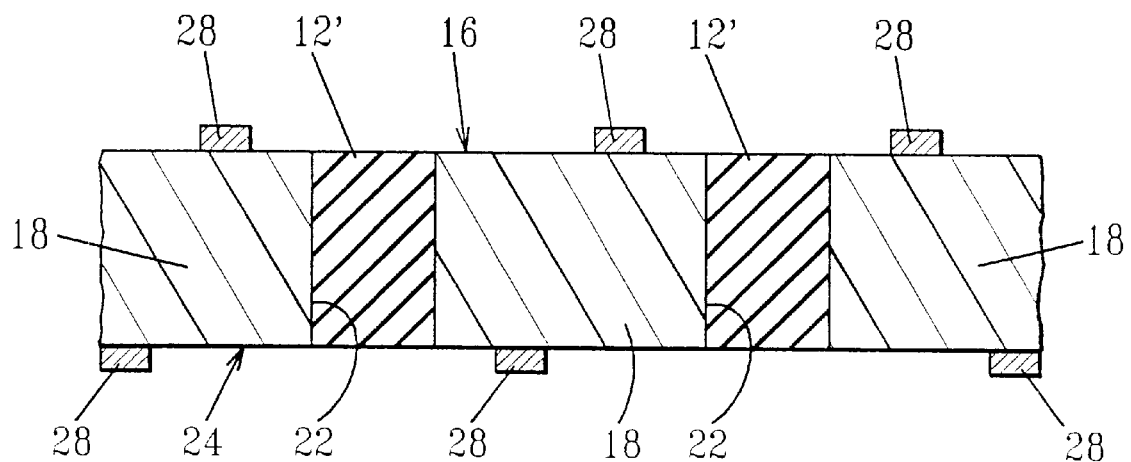

Next, the structure shown in FIG. 2(d) is circuitized in a desired pattern using circuitization techniques well known to those skilled in the art. The circuitized structure is shown in FIG. 2(e) wherein 28 represents circuit elements. Bond pads are finished by Ni and Au plating by well known methods in the art.

Figure 2F:
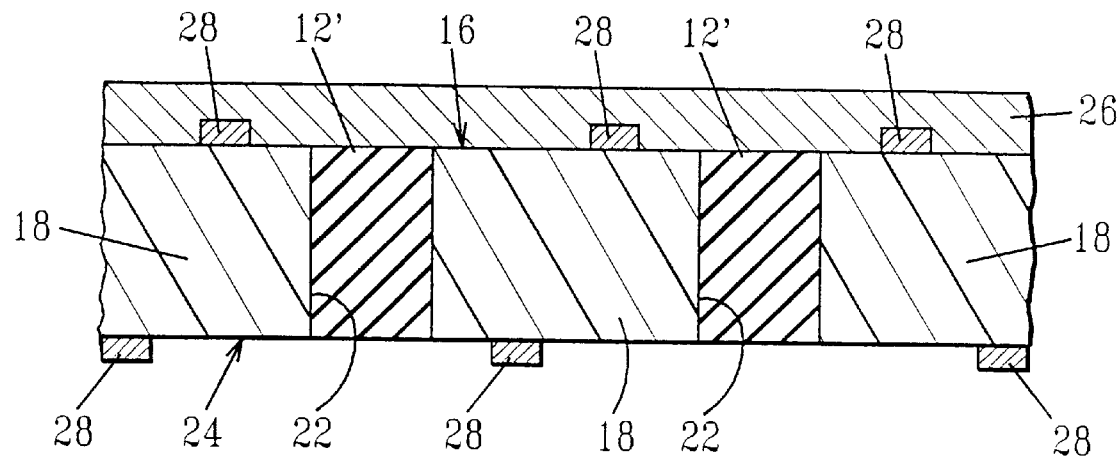
Figure 2G:
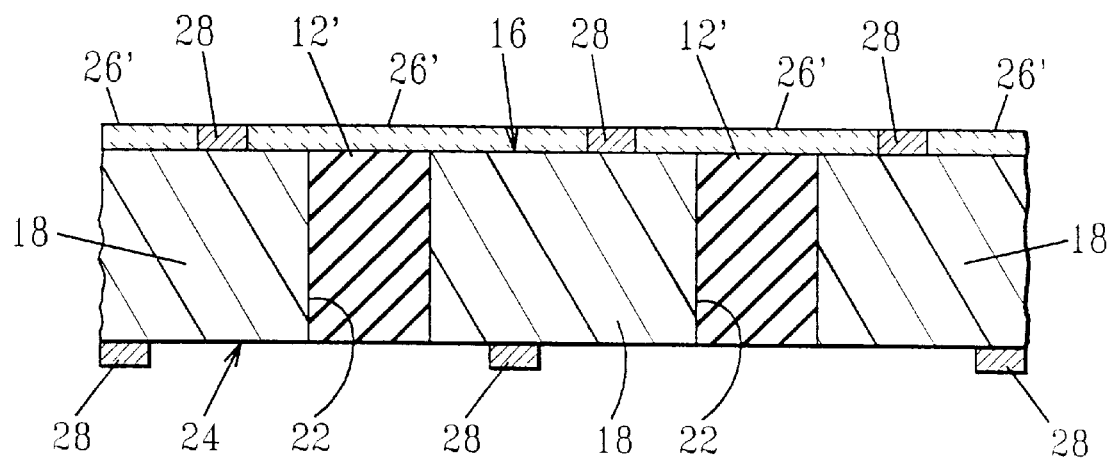

A solder mask 26 as defined hereinabove in regard to the embodiment shown in FIG. 1 is applied to the circuit board (see FIG. 2(f)) and thereafter it is processed using the patterning step, i.e. blanket light exposure step, solvent development step and curing step defined hereinabove in regard in the patterned circuit board shown in FIG. 1. The final structure using the nonpatterned embodiment is shown in FIG. 2(g).

While the invention has been particularly shown and described with respect to preferred embodiments thereof, it will be understood by those skilled in the art that the foregoing and other changes in form and detail may be made without departing from the scope and spirit of the present invention. It is thereof intended that the present invention not be limited to the exact forms described and illustrated, but fall within the scope of the appended claims.

Having thus described our invention, what we claim as new, and desire to secure by the Letters Patent is:

1. A method for planarizing circuit board apertures comprising the steps of:
   (a) applying a photoimageable dielectric composition onto a surface of a support film to provide a photoimageable film composition, wherein said support film is peelable and is optically transparent;
   (b) drying the support photoimageable film composition to remove any solvent present therein;
   (c) applying said dry, photoimageable film composition adjacent to at least one surface of a circuit board having apertures therein;
   (d) laminating said structure provided in step (c) under conditions effective to soften said dry, photoimageable film composition so that said soften material flows into said apertures and fills the same;

(e) exposing the structure provided in step (d) in a desired aperture-wise pattern;

(f) peeling the support film and developing unexposed regions of the photoimageable film composition from said surface of said circuit board whereby nubs are formed over said apertures;

(g) applying a solder mask to the structure;

(h) patterning areas on said solder mask; and (i) curing said solder mask.

2. The method of claim 1 wherein said support film is composed of a polyester resin or a polyolefin resin.

3. The method of claim 2 wherein said support film is a polyester resin.

4. The method of claim 1 wherein said photoimageable dielectric composition is an aqueous or solvent developed composition, free radical or cationic polymerizable composition.

5. The method of claim 1 wherein said circuit board is a patterned or nonpatterned circuit board.

6. The method of claim 5 wherein said patterned circuit board further contains intermediate layers, bond pads and circuitry thereon.

7. The method of claim 5 wherein said circuit board is nonpatterned.

8. The method of claim 7 wherein, prior to applying the solder mask to the structure, the structure provided in step (f) is subjected to nub removal and circuitization.

9. The method of claim 8 wherein nub removal is carried out by chemical polishing, chemical mechanical polishing or belt sanding.

10. The method of claim 7 further comprising curing said nubs prior to removal.

11. The method Of claim 10 wherein said curing is carried out at a temperature of from about 100° to about 150° C. for a time period of from about 60 to 80 minutes.

12. The method of claim 1 wherein said aperture is a via, a plated through hole or a non-plated through hole.

13. The method of claim 1 wherein said drying step is conducted at a temperature of about 120° C. or less for a time period of from about 5 to about 90 minutes.

14. The method of claim 1 wherein said drying step is conducted at a temperature of from about 60° to about 100° C. for a time period of from about 15 to about 60 minutes.

15. The method of claim 1 wherein step (c) is carried by vacuum lamination.

16. The method of claim 15 wherein said vacuum lamination is a high vacuum lamination process wherein the pressure is from about 150 to about 700 psi.

17. The method of claim 15 wherein said vacuum lamination is a resist vacuum lamination process wherein the pressure is from about 2 to about 25 psi.

18. The method of claim 16 wherein said high vacuum lamination process is carried out by raising the temperature from room temperature to a temperature of about 150° C. and a ramp rate of from about 5 to about 15° C./min and then maintaining said temperature for a time period of from about 15 to about 60 minutes.

19. The method of claim 17 wherein said resist vacuum lamination process is carried out by raising the temperature from room temperature to a temperature of about 110° C. and a ramp rate of from about 3 to about 10° C./min and then maintaining said temperature for a time period of from about 2 to about 10 minutes.

20. The method of claim 1 wherein step (e) is carried out at a photo-master contact pressure of from about 3 to about 8 psi, an energy of from about 800 to about 2000 milliJoules/$cm^2$ using a 365 nm arc 8 kilowatt lamp.

21. The method of claim 20 wherein step (e) is carried out at a photo-master contact pressure of from about 4 to about 6 psi and an energy from about 1000 to about 1500 milliJoules/$cm^2$.

22. The method of claim 21 wherein step (e) is carried out at a contact pressure of 5 psi and an energy of 1500 milliJoules/$cm^2$.

23. The method of claim 1 wherein step (f) includes the use of a developer solution which is capable of dissolving the unexposed regions of said photoimageable film composition.

24. The method of claim 23 wherein said developer solution is an organic solvent or aqueous solution selected from the group consisting of sodium hydroxide, propylene carbonate, gamma butyrolactone, sodium carbonate, benzyl alcohol, diglyme and mixtures thereof.

25. The method of claim 1 wherein step (h) comprises blanket exposure and solvent development.

26. The method of claim 25 wherein said blanket light exposure is conducted using a UV cure tool that operates at energies of from about 500 to about 2500 Joules/$cm^2$.

27. The method of claim 26 wherein said blanket light exposure is conducted using a UV cure tool that operates at energies of from about 200 to about 1500 Joules/$cm^2$.

28. The method of claim 1 wherein said curing is carried out at a temperature of from about 100° to about 150° C. for a time period of from about 60 to about 180 minutes.

29. The method of claim 28 wherein said curing is carried out at a temperature of from about 130° to about 150° C. for a time period of from about 60 to about 120 minutes.

* * * * *